(12) United States Patent
Barry

(10) Patent No.: US 11,586,495 B2
(45) Date of Patent: Feb. 21, 2023

(54) FUSE LOGIC TO PERFORM SELECTIVELY ENABLED ECC DECODING

(71) Applicant: Micron Technology, Inc., Boise, ID (US)

(72) Inventor: Beau D. Barry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/929,253

(22) Filed: Jul. 15, 2020

(65) Prior Publication Data
US 2022/0019500 A1 Jan. 20, 2022

(51) Int. Cl.
G06F 11/10 (2006.01)
G06F 11/22 (2006.01)
G06F 11/30 (2006.01)

(52) U.S. Cl.
CPC ........ G06F 11/1044 (2013.01); G06F 11/221 (2013.01); G06F 11/2215 (2013.01); G06F 11/3027 (2013.01)

(58) Field of Classification Search
None
See application file for complete search history.

(56) References Cited

U.S. PATENT DOCUMENTS

| | | | | |
|---|---|---|---|---|
| 5,592,235 A * | 1/1997 | Park | ................ | H04N 7/015 348/555 |
| 6,335,645 B1 * | 1/2002 | Matsuo | ............... | G01R 31/3016 327/141 |
| 6,386,456 B1 * | 5/2002 | Chen | ................ | H01L 23/544 235/487 |
| 6,732,266 B1 * | 5/2004 | Anderson | ............. | H05K 1/029 710/12 |
| 7,689,881 B2 * | 3/2010 | Shuma | ................ | G06F 11/1008 714/718 |
| 8,325,548 B2 * | 12/2012 | Matsuo | ................ | G11C 29/808 365/201 |
| 8,972,835 B1 * | 3/2015 | Rahul | ................. | H03M 13/036 714/800 |
| 2002/0048191 A1 * | 4/2002 | Ikehashi | ................ | G11C 29/12 365/185.22 |
| 2004/0153900 A1 * | 8/2004 | Adams | ................. | G11C 29/802 714/710 |
| 2005/0076274 A1 * | 4/2005 | Nagai | .................... | G11C 29/52 714/718 |

(Continued)

*Primary Examiner* — Cynthia Britt
*Assistant Examiner* — Dipakkumar B Gandhi
(74) *Attorney, Agent, or Firm* — Dorsey & Whitney LLP

(57) ABSTRACT

Fuse logic is configured to selectively enable certain group of fuses of a fuse array to support one of column (or row) redundancy in one application or error correction code (ECC) operations in another application. For example, the fuse logic may decode the group of fuses to enable a replacement column (or row) of memory cells in one mode or application, and decodes a subset of the group of fuses to retrieve ECC data corresponding to a second group of fuses are encoded to enable a different replacement column or row of memory cells in a second mode or application. The fuse logic includes an ECC decode logic circuit that is selectively enabled to detect and correct errors in data encoded in the second group of fuses based on the ECC data encoded in the subset of fuses of the first group of fuses.

20 Claims, 5 Drawing Sheets

(56) References Cited

U.S. PATENT DOCUMENTS

| | | | | |
|---|---|---|---|---|
| 2011/0280086 | A1* | 11/2011 | Choi | G11C 7/1048 |
| | | | | 365/189.07 |
| 2017/0169905 | A1* | 6/2017 | Walton | G06F 3/0656 |
| 2018/0060165 | A1* | 3/2018 | Kim | G11C 29/52 |
| 2018/0336959 | A1* | 11/2018 | Minzoni | G11C 29/028 |
| 2019/0196904 | A1* | 6/2019 | Kim | G11C 29/76 |

* cited by examiner

US 11,586,495 B2

FUSE LOGIC TO PERFORM SELECTIVELY ENABLED ECC DECODING

BACKGROUND

High data reliability, high speed of memory access, low power, and reduced chip size are features that are demanded from semiconductor memory. Memory cells used to store information within a memory may be organized into rows (word lines) and columns (bit lines). At various points in manufacturing and use of a memory device, one or more memory cells may fail (e.g., become unable to store information, be inaccessible by the memory device, etc.) and may need to be repaired. Some memory devices may include fuses that are programmed to redirect addresses of defective memory cells to redundant memory cells. When, during a fuse read operation, the states of the fuses are inaccurately read, redundant memory cells may be mapped to replace healthy memory cells and defective memory cells may be accessed normally, which may adversely affect the reliability of the memory. Along a device production lifecycle, production-induced deficiencies may decrease over time as production processes mature. A size of a fuse array and/or a count of redundant memory rows and columns may be based on anticipated or actual production-induced deficiencies to achieve a certain device yield at a start of production, which may result in portions of the fuse array and/or redundant memory rows and/or columns.

DETAILED DESCRIPTION

Figure 1:
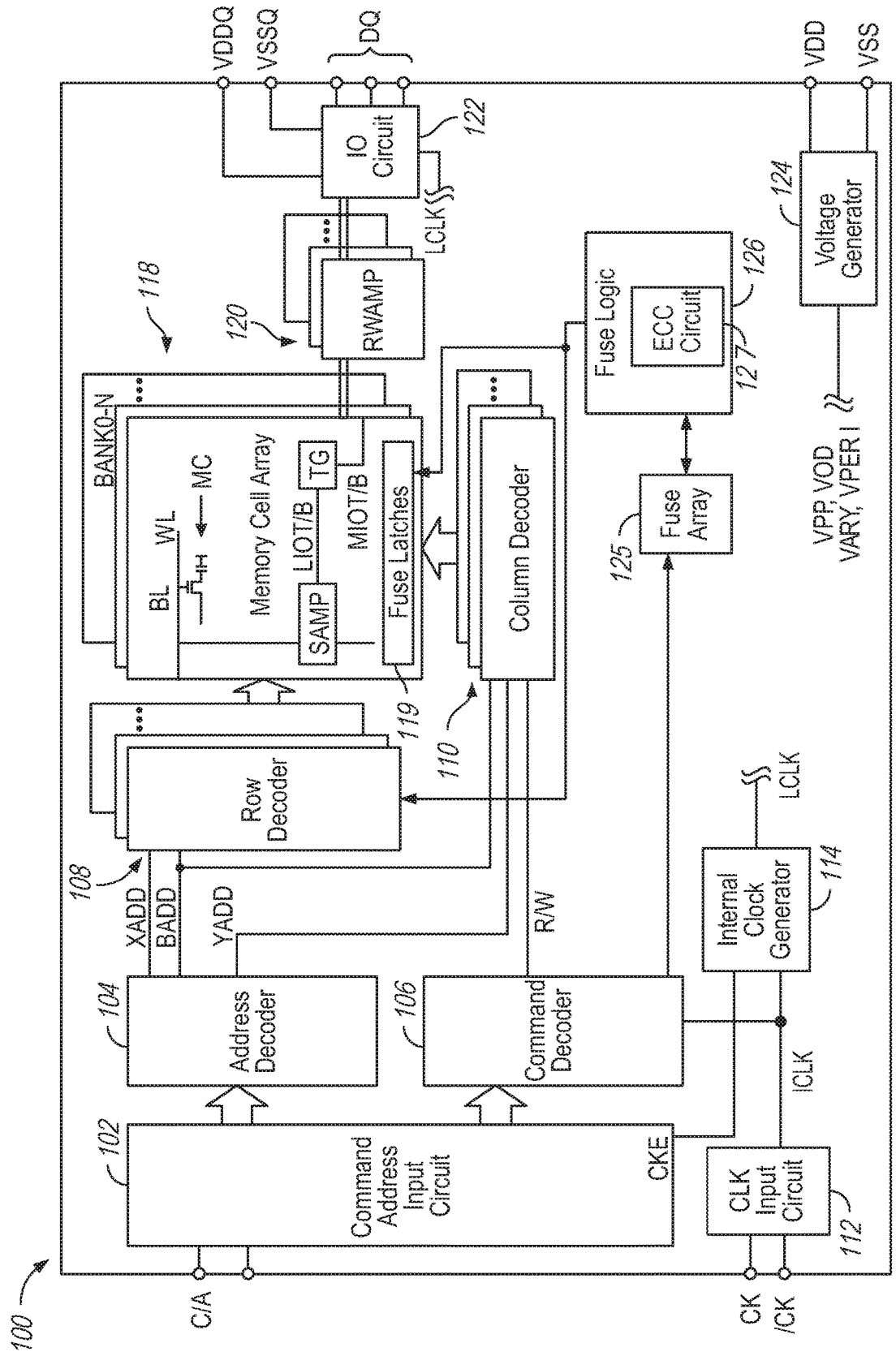
FIG. 1 is a block diagram of a semiconductor device according to an embodiment of the present disclosure.

This disclosure describes examples of selectively enabling certain group of fuses of a fuse array to support one of column (or row) redundancy or error correction code (ECC) operations during decode of fuses by fuse logic. For example, the group of fuses may be encoded to enable a replacement column (or row) of memory cells in one device, and a subset of the group of fuses may be encoded with ECC data corresponding to a second group of fuses that may be encoded to enable a different replacement column or row of memory cells in another memory device. The fuse logic may include an ECC decode logic circuit that is selectively enabled to detect and correct errors in data encoded in the second group of fuses based on the ECC data encoded in the subset of fuses of the first group of fuses. As previously noted, defective rows and/or columns of memory cells may be more prevalent early in a product lifecycle, so a fuse array size may be selected to compensate an anticipated increased prevalence of defective rows and/or columns of memory cells.

As the production processes mature, a number of expected defective rows and/or columns of memory cells in each device decreases, leaving large sections of a fuse array unused. In addition, fuse programming is a one-time event. As such, errors may occur when fuses are programmed. Lastly, in some instances, fuse component degradation over the life of a device may cause incorrect values to be read from one or more fuses. Thus, in some examples, the fuse logic circuitry may include additional circuitry to support ECC operations associated with fuses programmed to enable replacement rows or columns of memory cells. The additional circuitry may include an ECC logic circuit and/or multiplexers that selectively route original or corrected (e.g., via the ECC logic circuit) fuse bus data to downstream circuitry to enable corresponding replacement rows or columns of memory cells. The ECC logic circuitry may receive the original fuse bus data and ECC data, and may perform an ECC operation to correct (e.g., or deactivate) the original fuse bus data when an error is detected. Re-using fuses of the fuse array for ECC operations may improve reliability associated with reading data from the fuse array due to an ability to detect and correct errors in the fuse data.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

FIG. 1 is a block diagram of a semiconductor device 100 according to an embodiment of the disclosure. The semiconductor device 100 may include a CLK input circuit 112, an internal clock generator 114, an address/command input circuit 102, an address decoder 104, a command decoder 106, a plurality of row (e.g., first access line) decoders 108, a memory cell array 118 including sense amplifiers SAMP and transfer gates TG, a plurality of column (e.g., second access line) decoders 110, read/write amplifiers 120, an input/output (I/O) circuit 120, a voltage generator circuit 124, a fuse array 125, fuse logic 126, and a fuse error detection circuit 180. The semiconductor device 100 may include a plurality of external terminals including address and command terminals C/A coupled to command/address bus, clock terminals CK and /CK, data terminals DQ, DQS, and DM, and power supply terminals VDD and VSS.

The memory cell array 118 includes a plurality of banks BANK0-N, where N is any integer, such as 2, 4, 8, 16, 32, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 108 and the selection of the bit line BL is performed by a corresponding column decoder 110. The plurality of sense amplifiers SAMP are located for their corresponding bit lines BL and coupled to at least one respective local I/O line further coupled to a respective one of at least two main I/O line pairs, via transfer gates TG, which function as switches. The sense amplifiers SAMP and transfer gates TG may be operated based on control signals from decoder circuitry, which may include the command decoder 106, the row decoders 108, the column decoders 110, any control circuitry of the memory cell array 118 of the banks BANK0-7, or any combination thereof.

The command/address input circuit 102 may receive an address signal and a bank address signal from outside at the command/address terminals C/A via a command/address bus and transmit the address signal and the bank address signal to the address decoder 104. The address decoder 104 may decode the address signal received from the command/ address input circuit 102 and provide a row address signal XADD to the row decoder 108, and a column address signal YADD to the column decoder 110. The address decoder 104 may also receive the bank address signal and provide the bank address signal BADD to the row decoder 108 and the column decoder 110.

The command/address input circuit 102 may receive a command signal from outside, such as, for example, a memory controller at the command/address terminals C/A via the command/address bus and provide the command signal to the command decoder 106. The command decoder 106 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 118 designated by the row address and the column address. The read/write amplifiers 120 may receive the read data DQ and provide the read data DQ to the IO circuit 122. The IO circuit 122 may provide the read data DQ to outside via the data terminals DQ. Similarly, when the write command is issued and a row address and a column address are timely supplied with the write command, and then the TO circuit 122 may receive write data at the data terminals DQ and provide the write data via the read/write amplifiers 120 to the memory cell array 118. Thus, the write data may be written in the memory cell designated by the row address and the column address.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 112. The clock input circuit 112 may receive the external clock signals and generate an internal clock signal ICLK. The clock input circuit 112 may provide the internal clock signal ICLK to an internal clock generator 114. The internal clock generator 114 may generate a phase controlled internal clock signal LCLK based on the received internal clock signal ICLK and a clock enable signal CKE from the command/ address input circuit 102. Although not limited thereto, a DLL circuit may be used as the internal clock generator 114. The internal clock generator 114 may provide the phase controlled internal clock signal LCLK to the IO circuit 122. The IO circuit 122 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 124. The voltage generator circuit 124 may generate various internal voltages, VPP, VOD, VARY, VPERI, and the like based on the power supply voltages VDD and VSS. The internal voltage VPP is mainly used in the row decoder 108, the internal voltages VOD and VARY are mainly used in the sense amplifiers SAMP included in the memory cell army 118, and the internal voltage VPERI is used in many other circuit blocks. The IO circuit 122 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 122.

In some examples, the semiconductor device 100 may use various configuration parameters or settings during power- up and operation, such as start-up parameters and settings, redundancy settings, options settings, identification (ID) settings, or any combination thereof. The configuration parameters may be used by the semiconductor device 100 to specify operational characteristics, such as voltage levels, timing configurations, I/O and other bus configurations, etc. Some of the configuration parameters or settings may be associated with redundancy configurations, such as identifying which memory addresses are to be redirected from a defective row or column of memory cells to a redundant row or column of memory cells.

The semiconductor device 100 may include the fuse array 125 that includes a plurality of programmable storage elements (e.g., fuses, anti-fuses, etc.) configured to store the configuration parameters and settings. The storage elements may include start-up (e.g., or power-up) storage elements, redundancy storage elements, options storage elements, identification (ID) storage elements, or any combination thereof.

During a fuse read operation, information programmed (e.g., stored) at the fuse array 125 (e.g., fuse data) may be provided along a fuse bus (FB) to the fuse logic 126. The fuse logic 126 may provide the fuse data to various components of the semiconductor device 100, such as the row decoder 108, and the memory cell array 118. For example, the memory cell array 118 may include fuse latches 119 that are each associated with a particular access line (e.g., wordline WL or bitline BL) of the memory cell array 118. The fuse latches 119 may read the fuse data to enable or disable access to respective memory cells along a respective row or column of the memory cell array 118. For example, a fuse latch of the fuse latches 119 may enable a redundant row or column of memory cells and a second fuse latch may disable a defective row or column of memory cells. The row decoder 108 may use the fuse data to determine which memory addresses should be directed to a redundant row or column of memory cells. Some of the fuse data may also be provided to circuits of the semiconductor device 100, such as the command decoder 106, the clock input circuit 112, the internal clock generator 114, the voltage generator 124, the IO circuit 122, etc.

In some examples, the fuse data may be divided into subsets of bits (e.g., subsets of data) that are serially broadcast from the fuse array 125 to the fuse logic 126 during a fuse read operation. The fuse logic 126 may latch each respective subset of bits of the fuse data from the fuse array 125, and may provide the respective subset of bits to the row decoder 108 and/or the memory cell array 118 via a fuse bus FB. A count of bits in the subset of bits may be based on a width of (e.g., number of channels or signal lines along) the fuse bus. The fuse array 125 and the fuse logic 126 may be clocked according to a select clock signal.

In some examples, such as when a fuse becomes defective or as a result of another operational anomaly, the fuse array 125 and/or the fuse logic 126 may read and provide erroneous fuse data to the row decoder 108 and/or the memory cell array 118. The erroneous fuse data may adversely affect performance of the semiconductor device 100, in some examples. In some examples, the fuse logic 126 may include circuitry that is configured to selectively enable an ECC operation associated with the fuse data read from the fuse array 125. The ECC operations may be enabled via another fuse or configuration parameter of the semiconductor device 100, such as from a mode register, an options circuit, or another programmable configuration circuit.

When the ECC operation is disabled, a first group of fuse data bits and a second group of data bits may be provided to the row decoders 108 or the fuse latches 119 to enable a respective replacement column (or row) of memory cells or disable a respective defective column (or row) of memory cells in the semiconductor device 100. When the ECC operation is enabled, an ECC circuit 127 of the fuse logic 126 may perform an ECC operation on a second group of fuse data bits based on ECC data encoded in a subset of the first group of fuse data bits to provide corrected second group of fuse data bits. The corrected second data bits may be provided to the row decoders 108 or the fuse latches 119 to enable a replacement column (or row) of memory cells or disable a defective column (or row) of memory cells in the semiconductor device 100. In some examples, a default bit value (e.g., low logic value) may be provided to the fuse latches 119 in place of the first group of fuse data bits when the ECC operation is enabled. In some examples, the fuse logic 126 may include multiplexers to selectively provide the second group of fuse data bits or the corrected second group of fuse data bits to the address latches 119. Providing an ability to implement ECC operations during fuse data decoding may reliability of the semiconductor device 100 for operations that rely on correct and valid fuse data.

Figure 2:
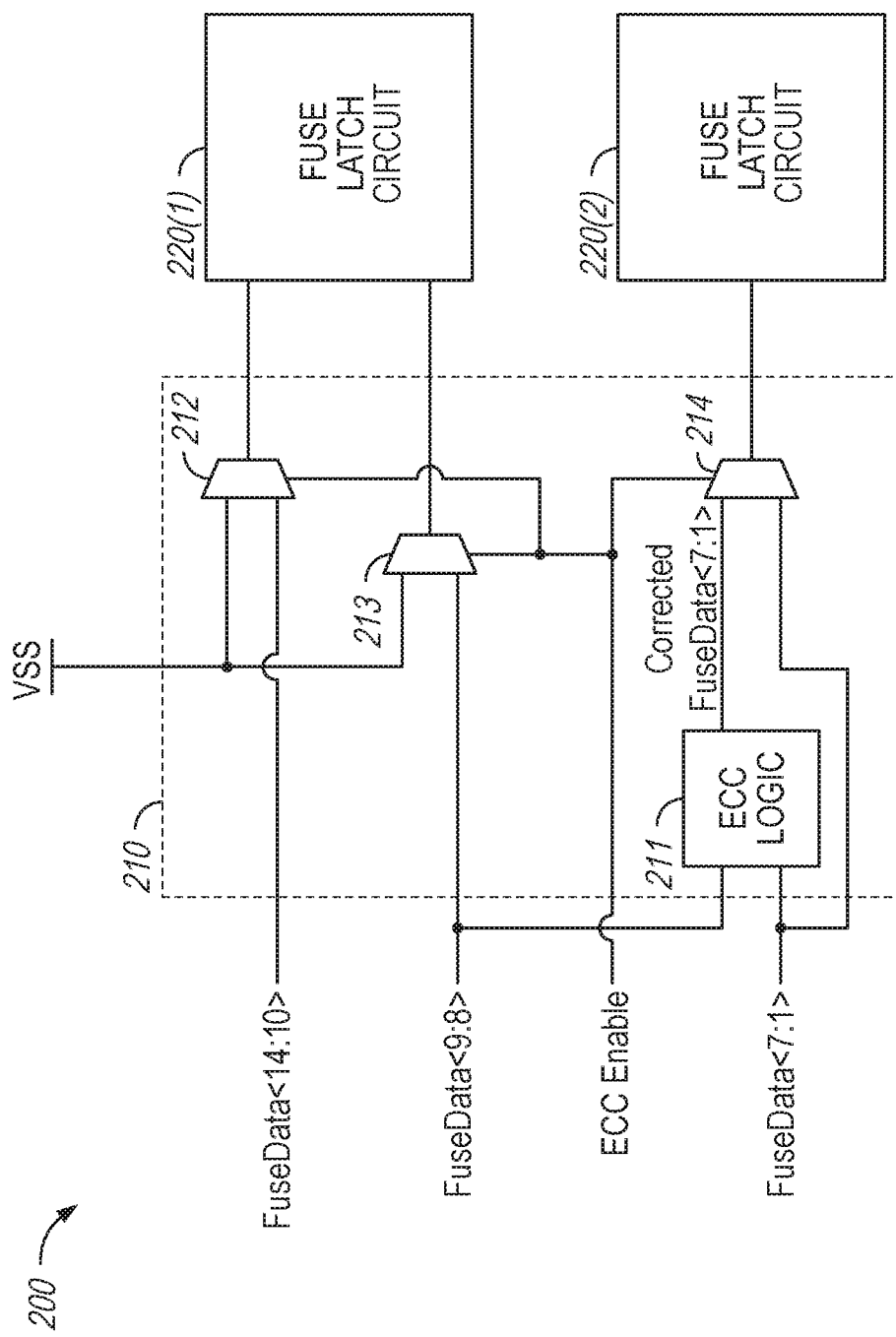
FIG. 2 is a block diagram of a portion of fuse logic circuitry of a semiconductor device according to an embodiment of the present disclosure.

FIG. 2 is a block diagram of a portion of fuse logic circuitry 200 of a semiconductor device according to an embodiment of the present disclosure. The fuse logic circuitry 200 includes an ECC circuit 210 coupled to fuse latch circuits 220(1)-(2). The semiconductor device 100 of FIG. 1 may implement the fuse logic circuitry 200, in some examples.

The ECC circuit 210 may include a ECC logic 211 coupled to multiplexers 214, multiplexers 212, and multiplexers 213, and may be configured to receive fuse data FuseData<14:1> from a fuse array (not shown) via a fuse bus. The ECC logic 211 may receive data FuseData<9:1>. The ECC logic 211 may be configured to perform an ECC operation based on the data FuseData<9:1> to provide corrected FuseData<7:1>. In an example, the FuseData<9:8> bits may be encoded with ECC data corresponding to expected data retrieved from the FuseData<7:1>. In response to detection of an error in the FuseData<7:1> based on values of the FuseData<9:8>, the ECC logic 211 may correct one or more bits of the FuseData<7:1> based on the FuseData<9:8> to provide the corrected FuseData<7:1>. If no error is detected, the ECC logic 211 provides the FuseData<7:1> as the corrected FuseData<7:1>. The multiplexers 214 may receive both the FuseData<7:1> and the corrected FuseData<7:1>, and may selectively provide one of the FuseData<7:1> or the corrected FuseData<7:1> to the fuse latch circuit 220(2) based on a value of an ECC enable signal. The ECC enable signal may be provided via the fuse bus as an additional FuseData bit, in some examples.

The multiplexers 212 may receive the FuseData<14:10> and a VSS source voltage, and may selectively provide one of the FuseData<14:10> or the VSS source voltage to the fuse latch circuit 220(1) based on a value of an ECC enable signal. The multiplexers 213 may receive the FuseData<9: 8> and the VSS source voltage, and may selectively provide one of the FuseData<9:8> or the VSS source voltage to the fuse latch circuit 220(1) based on a value of an ECC enable signal.

In some examples, the fuse latch circuits 220(1)-(2) may each be configured to enable a respective replacement row or column of memory cells. In other examples, the fuse latch circuits 220(1)-(2) may each be configured to disable a respective defective row or column of memory cells. In yet other examples, one of the fuse latch circuits 220(1)-(2) may be configured to enable a respective replacement row or column of memory cells, and the other of the fuse latch circuits 220(1)-(2) may be configured to disable a respective defective row or column of memory cells.

In operation, the ECC circuit 210 may operate in one of at least two different modes. In an example, the mode of operation of the ECC circuit 210 may be controlled by the value of the ECC enable signal. The ECC enable signal may be additional fuse data from a fuse array, or may be another configuration parameter or setting from the semiconductor device. In a first mode of operation, the ECC logic 211 may be disabled or unused, and ECC circuit 210 may provide the FuseData<14:8> (via the multiplexers 212 and the multiplexers 213) to the fuse latch circuit 220(1) and the FuseData<7:1> (via the multiplexers 214) to the fuse latch circuit 220(2). When operating in the first mode (e.g., with the ECC logic 211 disabled or unused), the ECC circuit 210 and the fuse latch circuits 220(1)-(2) may operate with full redundancy for high yield applications, such as for semiconductor devices that are early in a process lifecycle.

In a second mode of operation, the FuseData<9:8> bits may be encoded with an ECC that is based on an expected programmed value of fuses configured to store the FuseData<7:1> bits. The ECC logic 211 may be enabled or activated to provide the corrected FuseData<7:1> to the multiplexers 214 based on the ECC encoded in the FuseData <9:8> bits. The ECC received via the FuseData<9:8> may be used by the ECC logic 211 to detect and correct errors in the FuseData<7:1> to provide the corrected FuseData<7:1>. When no errors are detected, the ECC logic 211 is configured to provide the FuseData<7:1> as the corrected FuseData<7:1>. When one or more errors are detected in the FuseData<7:1>, the ECC logic 211 is configured to correct the one or more errors to provide the corrected FuseData<7: 1>.

The multiplexers 214 may provide the corrected FuseData<7:1> to the fuse latch circuit 220(2) in response to the ECC enable signal. In addition, the multiplexers 212 and the multiplexers 213 may collectively provide the VSS source voltage to the fuse latch circuit 220(1) in response to the ECC enable signal. The VSS source voltage may deactivate the fuse latch circuits 220(1), preventing enabling a replacement row or column of memory cells or disabling a defective row or column of memory cells. Thus, when operating in the second mode (e.g., when the ECC logic 211 is enabled or activated), the ECC circuit 210 and the fuse latch circuits 220(1)-(2) may operate with less than full redundancy (e.g., the fuse latch circuit 220(1) are effectively disabled via the VSS source voltage), but with higher fuse data integrity/reliability through use of the ECC logic 211 for applications where higher reliability is desired, such as for semiconductor devices in a more mature stage of a process lifecycle.

It is appreciated that the 14 total FuseData<14:1> bits to control the fuse latch circuits 220(1)-(2) (e.g., 7 bits per set of fuse latches) is exemplary, and more or fewer bits may be used based on an application. A count of bits may be based on a size of a row or column address. Further, in the second mode of operation, allocation of the two bits to the ECC (e.g., encoded in the FuseData<9:8>) is exemplary, and more than two bits may be allocated to the ECC without departing from the scope of the disclosure. In some examples, a count of bits allocated to the ECC may be based on a number of bits in the FuseData being evaluated for errors (e.g., more bits allocated to the ECC when more FuseData bits are being evaluated). Also, while FIG. 2 depicts the multiplexers 212, the multiplexers 213, and the multiplexers 214 using a single multiplexer, it is appreciated that the multiplexers 212, the multiplexers 213, and the multiplexers 214 may each include an individual multiplexer circuit for each bit received. Providing an ability to implement ECC operations during fuse data decoding may reliability of the semiconductor device for operations that rely on correct and valid fuse data.

Figure 3:
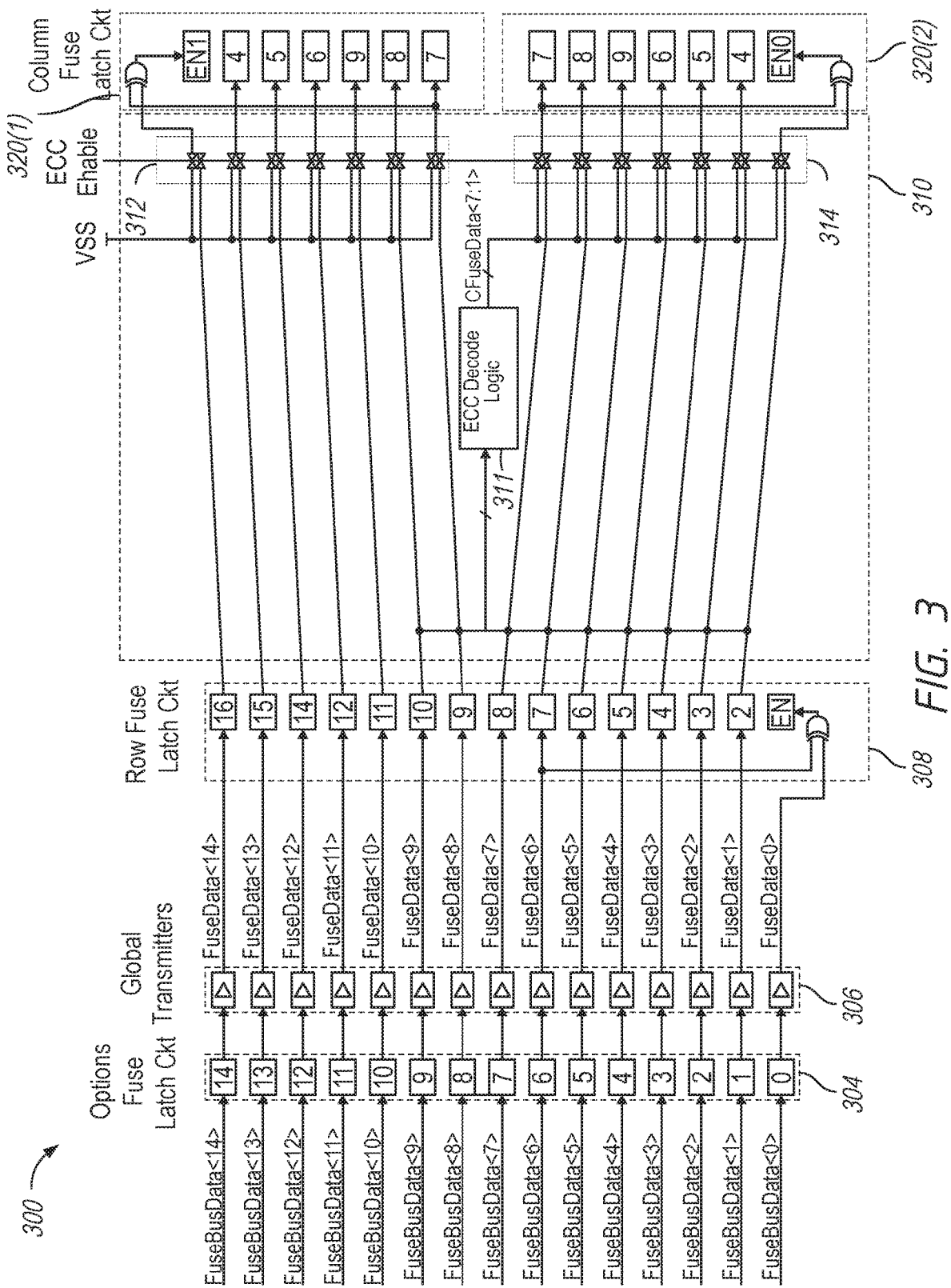
FIG. 3 is a schematic diagram of a portion of fuse logic circuitry of a semiconductor device according to an embodiment of the present disclosure.

FIG. 3 is a block diagram of a portion of fuse logic circuitry 300 of a semiconductor device according to an embodiment of the present disclosure. The fuse logic circuitry 300 includes option fuse latch circuit 304, driver circuit 306, row latch circuit 308, ECC circuit 310, and column fuse latch circuits 320(1)-(2). The semiconductor device 100 of FIG. 1 and/or the fuse logic circuitry 200 of FIG. 2 may implement the fuse logic circuitry 300, in some examples.

The option fuse latch circuit 304 may include a set of latches configured to latch values of FuseBusData<14:0> from a fuse array (not shown) via a fuse bus. The option fuse latch circuit 304 may latch values of the FuseBusData<14:0> to set or control configuration parameters of the semiconductor device. For example, the configuration parameters stored at the option fuse latch circuit 304 may be used by the semiconductor device to specify operational characteristics, such as voltage levels, timing configurations, I/O and other bus configurations, etc. In some examples, the option fuse latch circuit 304 may change the FuseBusData<14:0> for provision to downstream circuitry. The driver circuit 306 may receive the output of the option fuse latch circuit 304, and may drive FuseData<14:0> signals to the row latch circuit 308 based on the output of the option fuse latch circuit 304.

The row latch circuit 308 may be configured to enable a respective replacement row of memory cells or disable a respective defective row of memory cells based on the FuseData<14:0>. The row latch circuit 308 may include an exclusive OR gate that controls an enable latch EN based on the values of the FuseData<6> and the FuseData<0> bits. When the enable latch EN stores a first value, the row latch circuit 308 may be activated to enable the respective replacement row of memory cells or disable the respective defective row of memory cells. Otherwise, the row latch circuit 308 may be inactive or deactivated.

The ECC circuit 310 may include a ECC logic 311 coupled to a multiplexers 314, and a multiplexers 312, and may be configured to receive the FuseData<14:1> from the row latch circuit 308. The ECC logic 311 may receive data FuseData<9:1>. The ECC logic 311 may be configured to perform an ECC operation based on the data FuseData<9:1> to provide corrected CFuseData<7:1>. In an example, the FuseData<9:8> bits may be encoded with ECC data corresponding to expected data retrieved from the FuseData<7:1>. In response to detection of an error in the FuseData<7:1> based on values of the FuseData<9:8>, the ECC logic 311 may correct one or more bits of the FuseData<7:1> based on the FuseData<9:8> to provide the CFuseData<7:1>. If no error is detected, the ECC logic 311 provides the FuseData<7:1> as the CFuseData<7:1>. The multiplexers 314 may receive both the FuseData<7:1> and the CFuseData<7:1>, and may selectively provide one of the FuseData<7:1> or the CFuseData<7:1> to the column fuse latch circuit 320(2) based on a value of an ECC enable signal. The ECC enable signal may be provided via the fuse bus as an additional FuseData bit, in some examples.

The multiplexers 312 may receive the FuseData<14:8> and a VSS source voltage, and may selectively provide one of the FuseData<14:8> or the VSS source voltage to the column fuse latch circuit 320(1) based on a value of an ECC enable signal.

In some examples, the column fuse latch circuits 320(1)-(2) may each be configured to enable a respective replacement column of memory cells. In other examples, the column fuse latch circuits 320(1)-(2) may each be configured to disable a respective defective column of memory cells. In yet other examples, one of the column fuse latch circuits 320(1)-(2) may be configured to enable a respective replacement column of memory cells, and the other of the column fuse latch circuits 320(1)-(2) may be configured to disable a respective defective column of memory cells. The column fuse latch circuit 320(1) may include an exclusive OR gate that controls an enable latch EN1 based on the values of the FuseData<14> and the FuseData<8> bits. When the enable latch EN1 stores a first value, the column fuse latch circuit 320(1) may be activated to enable the respective replacement row of memory cells or disable the respective defective row of memory cells. Otherwise, the column fuse latch circuit 320(1) may be inactive or deactivated. Similarly, the column fuse latch circuit 320(2) may include an exclusive OR gate that controls an enable latch EN0 based on the values of the FuseData<7> and the FuseData<1> bits. When the enable latch EN0 stores a first value, the column fuse latch circuit 320(2) may be activated to enable the respective replacement row of memory cells or disable the respective defective row of memory cells. Otherwise, the column fuse latch circuit 320(2) may be inactive or deactivated.

In operation, the option fuse latch circuit 304 may latch values of the FuseBusData<14:0> to set or control configuration parameters of the semiconductor device, such as to specify operational characteristics of the semiconductor device (e.g., voltage levels, timing configurations, I/O and other bus configurations, etc.). The driver circuit 306 may receive the output of the option fuse latch circuit 304, and may drive FuseData<14:0> signals to the row latch circuit 308 based on the output of the option fuse latch circuit 304. The row latch circuit 308 may be configured to enable a respective replacement row of memory cells or disable a respective defective row of memory cells based on the FuseData<14:0>. The row latch circuit 308 may be activated based on a value stored at the enable latch EN. That is, when the enable latch EN stores a first value, the row latch circuit 308 may be activated to enable the respective replacement row of memory cells or disable the respective defective row of memory cells. Otherwise, the row latch circuit 308 may be inactive or deactivated.

The ECC circuit 310 may receive the FuseData<14:1> from the row latch circuit 308. The ECC circuit 310 may operate in one of at least two different modes. In an example, the mode of operation of the ECC circuit 310 may be controlled by the value of the ECC enable signal. The ECC enable signal may be additional fuse data from a fuse array, or may be another configuration parameter or setting from the semiconductor device. In a first mode of operation, the ECC logic 311 may be disabled or unused, and ECC circuit 310 may provide the FuseData<14:8> (via the multiplexers 312) to the column fuse latch circuit 320(1) and the FuseData<7:1> (via the multiplexers 314) to the fuse latches 320(2). When operating in the first mode (e.g., with the ECC logic 311 disabled or unused), the ECC circuit 310 and the fuse latches 320(1)-(2) may operate with full redundancy for high yield applications, such as for semiconductor devices that are early in a process lifecycle.

In a second mode of operation, the FuseData<9:8> bits may be encoded with an ECC that is based on an expected programmed value of fuses configured to store the FuseData<7:1> bits. The ECC logic 311 may be enabled or activated to provide the CFuseData<7:1> to the multiplexers 314 based on the ECC encoded in the FuseData <9:8> bits. The ECC received via the FuseData<9:8> may be used by the ECC logic 311 to detect and correct errors in the FuseData<7:1> to provide the CFuseData<7:1>. When no errors are detected, the ECC logic 311 is configured to provide the FuseData<7:1> as the CFuseData<7:1>. When one or more errors are detected in the FuseData<7:1>, the ECC logic 311 is configured to correct the one or more errors to provide the CFuseData<7:1>.

The multiplexers 314 may provide the CFuseData<7:1> to the column fuse latch circuit 320(2) in response to the ECC enable signal. In addition, the multiplexers 312 may provide the VSS source voltage to the column fuse latch circuit 320(1) in response to the ECC enable signal. The VSS source voltage may cause the enable latch EN1 to indicate that the column fuse latch circuit 320(1) are deactivated, which may prevent the column fuse latch circuit 320(1) from being used to enable a replacement row or column of memory cells or disable a defective row or column of memory cells. Thus, when operating in the second mode (e.g., when the ECC logic 311 is enabled or activated), semiconductor device may operate with less than full redundancy (e.g., with the column fuse latch circuit 320(1) being deactivated), but with higher fuse data integrity/reliability through use of the ECC circuit 310 for applications where higher reliability is desired, such as for semiconductor devices in a more mature stage of a process lifecycle.

It is appreciated that the 14 total FuseData<14:1> bits to control the column fuse latch circuits 320(1)-(2) (e.g., 7 bits per set of fuse latches) is exemplary, and more or fewer bits may be used based on an application. A count of bits may be based on a size of a row or column address. Further, in the second mode of operation, allocation of the two bits to the ECC (e.g., encoded in the FuseData<9:8>) is exemplary, and more than two bits may be allocated to the ECC without departing from the scope of the disclosure. In some examples, a count of bits allocated to the ECC may be based on a number of bits in the FuseData being evaluated for errors (e.g., more bits allocated to the ECC when more FuseData bits are being evaluated). Providing an ability to implement ECC operations during fuse data decoding may reliability of the semiconductor device for operations that rely on correct and valid fuse data.

Figure 4:
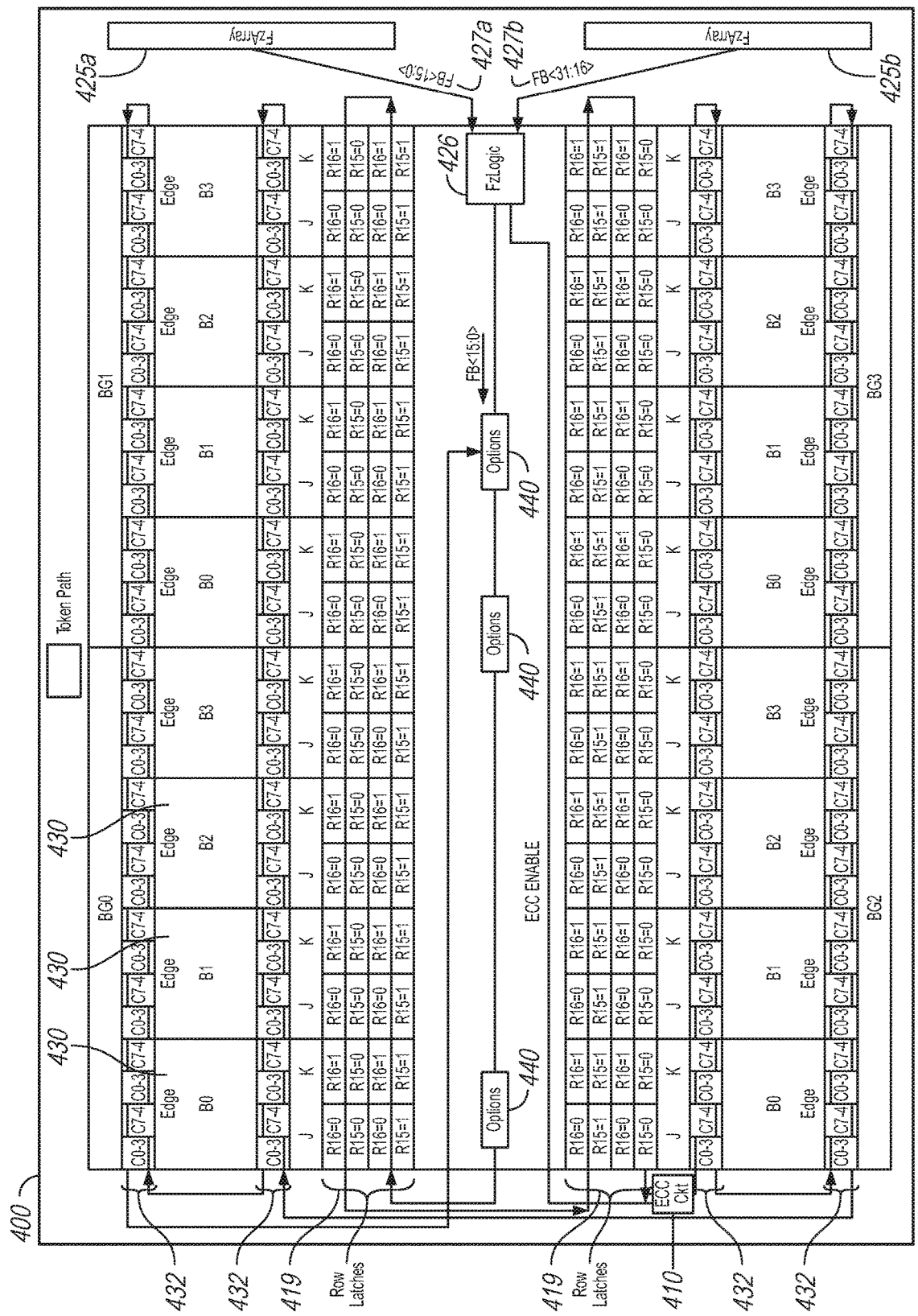
FIG. 4 is a block diagram representing a memory device according to an embodiment of the present disclosure.

FIG. 4 is a block diagram representing a memory device according to an embodiment of the present disclosure. FIG. 4 shows the transmission path of a fuse bus 428 from a pair of fuse arrays 425a and 425b through a memory array 400. In some embodiments, the memory array 400 may be an implementation of the memory cell array 118 of FIG. 1. However, the memory array 400 includes 16 banks 430 rather than the eight banks previously described with reference to the memory array 118. The 16 banks 430 are organized into four bank groups (BG0-BG3) of four banks 430 each. Each of the banks 430 is associated with a set of row latches 419 and column latches 432.

Addresses may be scanned out as part of fuse data along a fuse array buses FAB<15:0> and FAB<31:16> from the fuse arrays 425a-b, respectively, to the fuse bus FB<15:0> via the fuse logic 426. In the particular embodiment of FIG. 4, there may be a pair of fuse arrays 425a and 425b. The fuse array 425a may include a set of anti-fuses which may generally be used to store address information for a first portion of row addresses. The fuse array 425b may include a set of fuses which may generally be used to store address information for a second portion of row addresses. In some embodiments, the row addresses may be divided between the first portion and the second portion based on a numerical value assigned to the address. For example, the addresses may be sorted by numerical value, row addresses with the smaller values may be assigned to fuse array 425a, while row addresses with the larger values assigned to fuse array 425b. Since the value of the address may be expressed as a number in binary, for numbers with a high value, most of the bits of the number may be at a high logical level, while numbers with a low value may have most of the bits at a low logical level. Thus, it may be more efficient to store high value addresses in the fuse array 425b, which includes fuses that default to a high logical level and low value addresses in the fuse array 425a, which includes anti-fuses which default to a low logical level. Thus, a high value address assigned to the fuse array 425b may require less fuses to be blown than it would require anti-fuses to be blown in the fuse array 425a.

In some embodiments, the fuse array 425a may include anti-fuses, and may be a non-inverting fuse array (since the default value of the anti-fuses is a low logical level) and the fuse array 425b may include fuses and be an inverting fuse array. In some embodiments, it may be necessary to 'invert' an address (e.g., swap low logical levels for high logical levels and vice versa) provided from the inverting fuse array 425b.

While the organization of fuse arrays 425a and 425b will continue to be discussed herein as an example implementation, it should be understood that other methods of organizing addresses in the fuse array(s) may be used in other embodiments. For example, a single fuse array may be used with only fuses, only anti-fuses, or a mix thereof.

During a broadcast operation, the fuse arrays 425a-b may broadcast fuse data along the fuse array buses FAB<15:0> and FAB<31:16>, which may include the row addresses stored in the fuse arrays 425a-b. In the particular embodiment of FIG. 4, during the broadcast operation the fuse logic circuit 426 may receive a portion of the addresses along fuse array bus FAB<15:0> from the fuse array 425a, and a portion of the addresses along fuse array bus FAB<31:16> from the fuse array 425b. The fuse logic circuit 426 may combine the addresses onto the fuse bus FB<15:0> by alternating whether the addresses from the fuse array bus FAB<15:0> or the fuse array bus FAB<31:16> are provided along the fuse bus FB<15:0>. For clarity, the addresses provided along the fuse array bus FAB<15:0> may be referred to as 'even' addresses and the addresses provided along the fuse array bus FAB<31:16> may be referred to as 'odd' addresses. It should be understood that even and odd addresses refers to the fuse array 425a-b the address is stored in, and that both fuse array buses FAB<15:0> and FAB<31:16> may include addresses with numerical values which are both even and odd.

The fuse logic circuit 426 may provide data along the fuse bus FB<15:0>. The fuse logic circuit 426 may alternate between providing the even addresses from fuse array bus FAB<15:0> and the odd addresses from the fuse array bus FAB<31:16> along the fuse bus FB<15:0>. The fuse logic circuit 426 may also perform one or more operations based on the data of the fuse bus. For example, if one of the fuse arrays 625a-b is an inverting fuse array, the fuse logic circuit 426 may invert the value of addresses provided from the inverting fuse array.

The fuse bus FB<15:0> may pass data through one or more options circuits 440. The options circuits 440 may include various settings of the memory which may interact with the addresses along the fuse bus FB<15:0>. For example, the options circuits 440 may include fuse settings, such as the test mode and power supply fuses. Data stored in the fuse arrays 425a-b may be latched and/or read by the options circuits 440, which may then determine one or more properties of the memory based on the options data provided along the fuse bus 428.

After passing through the options circuits 440, the fuse bus FB<15:0> may pass through the row latches 419 for all of the memory banks 430 before passing through the column latches 432 for all of the memory banks 430. As well as providing fuse data (including address data) along the fuse bus FB<15:0>, the fuse logic circuit 426 may also provide one or more select signals along the fuse bus FB<15:0>. The select signals may be associated with a particular packet of data along the fuse bus, and may determine which circuit along the fuse bus FB<15:0> the particular packet of data is associated with. For example, if a row latch select signal is in an active state, it may indicate that the packet of data is to be stored in a row latch 419. In some embodiments, this may overwrite an address already stored in the row latch 419 with the address from the fuse bus FB<15:0>. Further select signals may be used to specify a particular location of the specific row latch 419 which is intended to store the packet of data (e.g., a bank group select signal, a bank select signal, etc.).

However, prior to passing through the column latches 432, the FB<15:0> may pass through an ECC circuit 410. In an example, the FB<15:0> may include a first fuse data to control a first set of the column latches 432 and a second fuse data to control a second set of the column latches 432. The ECC circuit 410 may be configured to selectively perform an ECC operation on the first fuse data received via the FB<15:0> based on a mode of operation of the semiconductor device 400. The mode of operation may be determined based on a bit of fuse data from the FB<15:0>, or via another external parameter. In a first mode of operation (e.g., no ECC operation), the ECC circuit 410 pass the first and second fuse data from the FB<15:0> through to the column latches 432 without changing the first or second fuse data. Thus, when operating in the first mode, the semiconductor device and the column latches 432 may operate with full redundancy for high yield applications, such as for semiconductor devices that are early in a process lifecycle.

In a second mode of operation (e.g., ECC operation performed), a portion of the second fuse data on the FB<15: 0> may be encoded with an ECC that is based on an expected programmed value of fuses configured to store the second fuse data. The ECC circuit 410 may be enabled or activated to provide corrected first fuse data to the first set of column latches 432 by detecting and correcting errors in the first fuse data. When no errors are detected, the ECC circuit 410 is configured to provide the first fuse data as the corrected first fuse data. When one or more errors are detected in the first fuse data, the ECC circuit 410 is configured to correct the one or more errors to provide the corrected first fuse data. The ECC circuit 410 is configured to provide the corrected first fuse data to the first set of column latches 432 when in the second mode of operation. In addition while in the second mode, the ECC circuit 410 may provide a default source voltage to the second set of column latches 432 to deactivate the second set. Because part of the second fuse data is repurposed to be encoded with the ECC, the second fuse data may be unavailable for use to enable replacement of a defective column of memory cells. Thus, when operating in the second mode (e.g., when the ECC mode is enabled or activated), the semiconductor device 400 may operate with less than full redundancy, but with higher fuse data integrity/reliability through use of the ECC operations for applications where higher reliability is desired, such as for semiconductor devices in a more mature stage of a process lifecycle.

Figure 5:
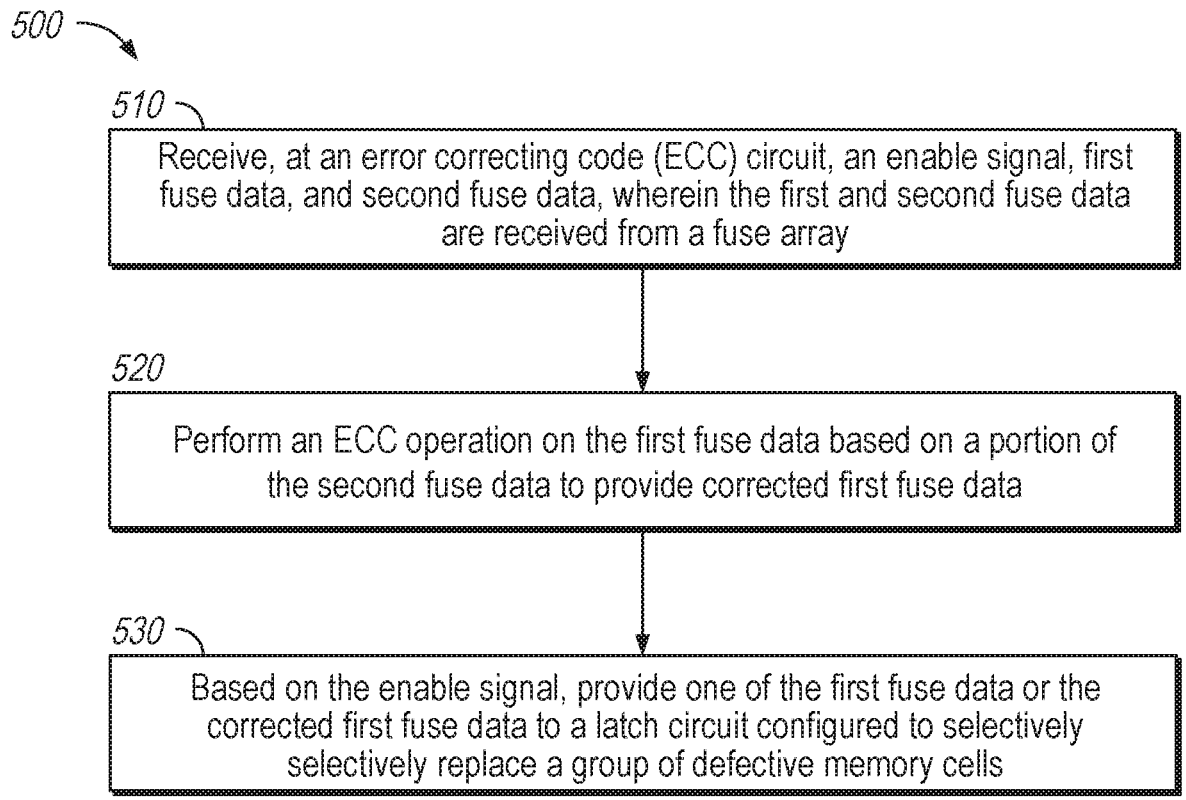
FIG. 5 is a flow diagram of a method 500 to detect selectively enable ECC operations for fuse array data, according to an embodiment of the present disclosure.

FIG. 5 is a flow diagram of a method 500 to detect selectively enable ECC operations for fuse array data, in accordance with an embodiment of the present disclosure. The method 500 may be performed, at least in part, by the fuse logic 126 of FIG. 1, the fuse logic circuitry 200 of FIG. 2, the fuse logic circuitry 300 of FIG. 3, the semiconductor device 400 of FIG. 4, or any combination thereof.

The method 500 may include receiving, at an error correcting code (ECC) circuit, an enable signal, first fuse data, and second fuse data, at 510. The first and second fuse data may be received from a fuse array (e.g., the fuse array 125 of FIG. 1 and/or one or both of the fuse arrays 427a or 427b of FIG. 4). The ECC circuit may include the ECC circuit 127 of FIG. 1, the ECC circuit 210 of FIG. 2, the ECC circuit 310 of FIG. 3, the ECC circuit 410 of FIG. 4, or any combination thereof. As an example, the first fuse data may include the FuseData<7:1> of FIG. 2 or 3 and the second fuse data may include the FuseData<14:8> of FIG. 2 or 3.

The method 500 may include performing an ECC operation on the first fuse data based on a portion of the second fuse data to provide corrected first fuse data, at 520. The ECC operation may be performed using ECC logic, such as the ECC logic 211 of FIG. 2 or the ECC logic 311 of FIG. 3. In some examples, the method 500 may further include performing the ECC operation on the first fuse data based on an ECC encoded in the portion of the second fuse data. The portion of the second fuse data may include the FuseData<9: 8> of FIGS. 2 and 3, in a specific example, although more or different bits may make up the ECC.

The method 500 may include, based on the enable signal, providing one of the first fuse data or the corrected first fuse data to a latch circuit configured to selectively replace a group of defective memory cells, at 530. The latch circuit may include some of the fuse latches 119 of FIG. 1, the latch circuit 220(2) of FIG. 2, the column latch circuit 320(2) of FIG. 3, any of the column latches 432 of FIG. 4, or any combination thereof. In some examples, the method 500 may further include selectively replacing a row of defective memory cells based on the one of the first fuse data or the corrected first fuse data.

In some examples, the method 500 may further include selectively replacing a column of defective memory cells based on the one of the first fuse data or the corrected first fuse data. In some examples, the method 500 may further include providing the second fuse data to a second latch circuit configured to selectively replace a second group of defective memory cells in response to the enable signal having a first value, and providing a source voltage to the second latch circuit in response to the enable signal having a second value. The second latch circuit may include some of the fuse latches 119 of FIG. 1, the latch circuit 220(1) of FIG. 2, the column latch circuit 320(1) of FIG. 3, any of the column latches 432 of FIG. 4, or any combination thereof. In some examples, the source voltage is a VSS voltage.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
    an error correcting code (ECC) circuit configured to receive an enable signal and to receive first fuse data from one or more first fuses and second fuse data from one or more second fuses via a fuse bus, wherein the ECC circuit is configured to perform an ECC operation on the first fuse data based on a portion of the second fuse data from the one or more second fuses to provide corrected first fuse data, wherein the ECC circuit is configured to provide one of the first fuse data or the corrected first fuse data at an output based on the enable signal; and
    a latch circuit comprising a plurality of latches configured to selectively replace a group of defective memory cells based on the one of the first fuse data or the corrected first fuse data.

2. The apparatus of claim 1, wherein the ECC circuit includes ECC logic configured to perform the ECC operation on the first fuse data based on an ECC encoded in the portion of the second fuse data.

3. The apparatus of claim 1, wherein the ECC circuit includes a set of multiplexers configured to provide the first fuse data in response to the enable signal having a first value and to provide the corrected first fuse data in response to the enable signal having a second value.

4. The apparatus of claim 1, wherein the ECC circuit is configured to provide the second fuse data to a second latch circuit configured to selectively replace a second group of defective memory cells in response to the enable signal having a first value.

5. The apparatus of claim 4, wherein the ECC circuit is configured to provide a source voltage to the second latch circuit in response to the enable signal having a second value.

6. The apparatus of claim 5, wherein the ECC circuit comprises a set of multiplexers configured to selectively provide the second fuse data or the source voltage to the second latch circuit based on the enable signal.

7. The apparatus of claim 1, wherein the latch circuit is configured to selectively replace a row of defective memory cells.

8. The apparatus of claim 1, wherein the latch circuit is configured to selectively replace a column of defective memory cells.

9. The apparatus of claim 1, further comprising a fuse array configured to provide the first and second fuse data.

10. The apparatus of claim 1, wherein the ECC circuit is configured to receive the enable signal via third fuse data.

11. An apparatus comprising:
    a fuse array comprising one or more first fuses and one or more second fuses, the fuse array configured to provide first fuse data from the one or more first fuses and second fuse data from the one or more second fuses to a fuse bus;
    a fuse logic circuit configured to receive the first fuse data from the one or more first fuses and second fuse data from the one or more second fuses via the fuse bus, the fuse logic circuit configured to perform an error correcting code (ECC) operation on the first fuse data using an ECC encoded in the second fuse data from the one or more second fuses to provide corrected first fuse data, wherein the fuse logic circuit is configured to provide one of the corrected first fuse data or the first fuse data as output first fuse data based on a mode of operation; and
    a latch circuit comprising a plurality of latches configured to selectively replace a group of defective memory cells based on the output first fuse data.

12. The apparatus of claim 11, wherein, while in a first mode of operation, the fuse logic circuit is configured to provide the first fuse data as the output first fuse data and to provide the second fuse data as output second fuse data.

13. The apparatus of claim 12, wherein, while in a second mode of operation, the fuse logic circuit is configured to provide the corrected first fuse data as the output first fuse data and to provide a source voltage as output second fuse data.

14. The apparatus of claim 12, further comprising a second latch circuit configured to selectively replace a second group of detective memory cells based on the second fuse data.

15. The apparatus of claim 11, wherein the fuse logic circuit is configured to determine the mode of operation based on third fuse data.

16. A method comprising:
    receiving, at an error correcting code (ECC) circuit, an enable signal from a programmable options circuit and first fuse data from one or more first fuses of a fuse array and second fuse data from one or more second fuses of the fuse array;
    performing an ECC operation on the first fuse data based on a portion of the second fuse data from the one or more second fuses to provide corrected first fuse data; and
    in response to the enable signal having a first value, providing the corrected first fuse data to a latch circuit configured to selectively replace a group of defective memory cells;
    in response to the enable signal having a second value, providing the first fuse data to the latch circuit configured to selectively replace the group of defective memory cells.

17. The method of claim 16, further comprising performing the ECC operation on the first fuse data based on an ECC encoded in the portion of the second fuse data.

18. The method of claim 16, further comprising:
    providing the second fuse data to a second latch circuit configured to selectively replace a second group of defective memory cells in response to the enable signal having a second value; and providing a source voltage to the second latch circuit in response to the enable signal having a first value.

19. The method of claim 16, further comprising selectively replacing a row of defective memory cells based on the one of the first fuse data or the corrected first fuse data.

20. The method of claim 16, further comprising selectively replacing a column of defective memory cells based on the one of the first fuse data or the corrected first fuse data.

* * * * *